(12) United States Patent
Musarra et al.

(10) Patent No.: US 12,487,620 B2
(45) Date of Patent: Dec. 2, 2025

(54) CURRENT BALANCING IN PARALLEL CONFIGURATION OF MULTIPLE POWER DEVICES

(71) Applicant: STMicroelectronics International N.V., Geneva (CH)

(72) Inventors: Federico Musarra, S. Agata li Battiati (IT); Sandor Petenyi, Lysa and Labem (CZ)

(73) Assignee: STMicroelectronics International N.V., Geneva (CH)

( * ) Notice: Subject to any disclaimer, the term of this patent is extended or adjusted under 35 U.S.C. 154(b) by 243 days.

(21) Appl. No.: 18/139,786

(22) Filed: Apr. 26, 2023

(65) Prior Publication Data
US 2024/0361791 A1    Oct. 31, 2024

(51) Int. Cl.
*G05F 1/575*    (2006.01)
*G05F 1/565*    (2006.01)
(Continued)

(52) U.S. Cl.
CPC .............. *G05F 1/575* (2013.01); *G05F 1/565* (2013.01); *G05F 1/59* (2013.01); *G05F 3/24* (2013.01)

(58) Field of Classification Search
CPC . G05F 1/56; G05F 1/563; G05F 1/565; G05F 1/567; G05F 1/569; G05F 1/573;
(Continued)

(56) References Cited

U.S. PATENT DOCUMENTS

2006/0203524 A1    9/2006  Ohno et al.
2016/0198533 A1    7/2016  Williams et al.
(Continued)

FOREIGN PATENT DOCUMENTS

JP    2014230307 A  *  12/2014

OTHER PUBLICATIONS

Sasaki, M., et al.: "Current Balancing Control for Parallel Connected IGBTs Using Programmable Gate Driver Output Resistance," Proceedings of The 25th International Symposium on Power Semiconductor Devices & ICs, Kanazawa, pp. 65-68, 2013, 4 pgs.
(Continued)

*Primary Examiner* — Thienvu V Tran
*Assistant Examiner* — Shahzeb K Ahmad
(74) *Attorney, Agent, or Firm* — Crowe & Dunlevy LLC

(57) ABSTRACT

An electronic device includes multiple integrated circuits, each containing a power transistor connected between an input voltage node and a load node, as well as a regulation circuit generating at least one sense current representing the output current of the power transistor. The regulation circuits modulate the output currents of their power transistors based on a value derived from the sense currents generated by the regulation circuits of other integrated circuits. This derived value can be based on an average of the sense currents generated by the regulation circuits or on one of the sense currents. In particular, the integrated circuits can be arranged in a daisy-chained relationship, allowing each regulation circuit to compare its sense current with the one from the immediately preceding circuit, except for the first regulation circuit, which compares its sense current with the last circuit's sense current in the chain.

15 Claims, 10 Drawing Sheets

(51) Int. Cl.
*G05F 1/59* (2006.01)
*G05F 3/24* (2006.01)

(58) Field of Classification Search
CPC ... G05F 1/575; G05F 1/59; G05F 1/61; G05F 3/24; H03K 17/56; H03K 17/567; H03K 17/687; H03K 17/28; H01L 29/7393
See application file for complete search history.

(56) References Cited

U.S. PATENT DOCUMENTS

| | | | | |
|---|---|---|---|---|
| 2017/0054439 | A1* | 2/2017 | Sasaki | H03K 17/127 |
| 2017/0250604 | A1* | 8/2017 | Ouyang | H02H 9/004 |
| 2019/0384337 | A1* | 12/2019 | Lu | G05F 1/575 |
| 2024/0063627 | A1* | 2/2024 | Wu | G01R 19/003 |
| 2024/0255977 | A1* | 8/2024 | Chen | H03K 19/017509 |

OTHER PUBLICATIONS

Perez-Delgado, Raul, et al.: "Current Sharing Control Strategy for IGBTs Connected in Parallel," Journal of Power Electronics, vol. 16, Issue 2, pp. 769-777, 2016, 12 pgs.

* cited by examiner

CURRENT BALANCING IN PARALLEL CONFIGURATION OF MULTIPLE POWER DEVICES

TECHNICAL FIELD

This disclosure is related to the field of power supply to multiple power integrated circuits (ICs) and, in particular, to circuits for balancing the current supplied to multiple power ICs.

BACKGROUND

In an electronic device, power supply to multiple parallel connected power integrated circuits (ICs) is an aspect of the design of particular interest. Failure to balance the current supplied to these power ICs can result in various issues, such as overheating, voltage drops, reduced efficiency, and noise/interference.

When the supplied current is not balanced, some power ICs may receive excessive current, causing them to overheat and potentially damage not only themselves but also other components in the device. This can ultimately reduce the lifespan of the device. Additionally, a lack of current balance can lead to voltage drops in certain areas of the device, causing it to malfunction. Noise and interference can also occur due to current imbalances, further impacting the device's performance and potentially leading to errors.

The above will now be explained in greater detail. Refer to FIG. 1, showing an electronic device 10 including a first power IC 11 with a first controller 12 driving the gate of a power MOS MN1 connected between the input voltage Vin and the load (represented as Rload), the first controller 12 driving the gate of the power MOS MN1 based upon sensing the output current Iout1 of the first power IC 11 as feedback. Similarly, the electronic device 10 includes the second power IC 14 with a second controller 15 driving the gate of the power MOS MN2 likewise connected between the input voltage Vin and the load, with the second controller 15 driving the gate of the power MOS MN2 based upon sensing the output current Iout2 of the second power IC 14 as feedback.

Electrical characteristics between the power ICs 11 and 14 may be mismatched. As a result, the gate voltages applied to the power MOSs MN1 and MN2, when compared to one another, are unequal and effectively have different offsets Voffset1 and Voffset2 applied thereto (represented as voltage sources in the drawing). As a result of these different voltage offsets Voffset1 and Voffset2, the output currents Iout1 and Iout2 are unequal.

Consider first the implications when the power MOSs MN1 and MN2 are operating in linear mode. In linear mode, the power MOSs MN1 and MN2 act as variable resistors. When one of the power MOSs MN1 and MN2 begins to conduct more current than the other, it will dissipate more power, causing it to heat up. As the MOSFET heats up when operating in linear mode, its on-resistance increases. However, as per Ohm's law, the current I through a resistor is directly proportional to the voltage V across the resistor and inversely proportional to the resistance R of the resistor (e.g., $I=V/R$), meaning that as the resistance of a resistor increases, the current through that resistor drops. This effectively self-limits the result of the current mismatch.

However, now consider the implications when the power MOSs MN1 and MN2 are operating in saturation mode. In saturation mode, the power MOSs MN1 and MN2 act as voltage controlled current sources. Therefore, the different voltage offsets Voffset1 and Voffset2 (resulting from the above-described mismatched electrical characteristics) result in the output currents Iout1 and Iout2 being mismatched. When one of the power MOSs MN1 and MN2 begins to conduct more current than the other, it will dissipate more power, causing it to heat up. When operating in saturation, heating of the MOS may increase the current through the MOS if operating with a gate-to-source voltage yielding a positive temperature coefficient with respect to temperature. This in turn will cause the MOS heat up even more and conduct even more current, leading to a positive feedback loop that can result in thermal runaway and ultimately failure of the MOS.

Given this, development is needed into current balancing schemes to provide for safe and proper operation of multiple parallel connected power ICs when operation in saturation mode for a period of time is contemplated.

SUMMARY

Broadly speaking, an electronic device disclosed herein features an input voltage node, a load node, and multiple integrated circuits. Each integrated circuit contains a power transistor connected between the input voltage node and the load node, as well as a regulation circuit that generates at least one sense current, which represents the output current of the power transistor. The regulation circuits are designed to modulate the output current of their respective power transistors based on a value derived from the sense currents generated by the regulation circuits of other integrated circuits in the device.

This derived value can be based on either an average of the sense currents generated by the regulation circuits of the other integrated circuits or on one of the sense currents generated by one of the regulation circuits of the other integrated circuits. The integrated circuits can be arranged in a daisy-chained relationship, allowing each regulation circuit, except for the first one in the daisy chain, to compare its associated sense current with the sense current generated by the regulation circuit of the immediately preceding integrated circuit in the daisy chain. The first regulation circuit in the daisy chain compares its associated sense current with the sense current generated by the regulation circuit of the last integrated circuit in the daisy chain.

In some configurations, each regulation circuit includes an amplifier that directly compares its associated sense current with the derived value and drives the gate of its corresponding power transistor based on the comparison.

In other configurations, each regulation circuit features a first amplifier that drives the gate of its corresponding power transistor, and the regulation circuit is designed to sink or source current from an input terminal of the first amplifier in response to a comparison between its associated sense current and the derived value. In this instance, each regulation circuit includes a second amplifier that performs the comparison between its associated sense current and the derived value and sinks or sources current from the input terminal of the first amplifier based on the comparison.

Also disclosed herein is an electronic device features an input voltage node, a load node, and two integrated circuits. The first integrated circuit includes a first power transistor connected between the input voltage node and the load node, and a first regulation circuit that generates first and second sense currents representing the output current of the first power transistor. The second integrated circuit contains a second power transistor connected between the input voltage node and the load node, and a second regulation circuit that generates third and fourth sense currents representing the output current of the second power transistor.

The first and second regulation circuits are designed to adjust the output currents of the first and second power transistors, respectively, based on the comparison of the first and third sense currents with the average of the second and fourth sense currents. The device may also include external resistors connected to the first, third, second, and fourth sense currents, producing voltages that represent the output currents of the first and second power transistors and their average.

The first and second regulation circuits can include multiple amplifiers with inputs coupled to receive various combinations of voltages and soft start voltages. The amplifiers are designed to either source or sink current from their outputs based on the comparisons of the voltages. In some configurations, the first and second regulation circuits may contain resistor ladders coupled between the outputs of the power transistors or the amplifiers and a reference voltage. The taps of these resistor ladders are connected to the outputs of the corresponding amplifiers.

In another configuration, the device can have resistors within the first and second integrated circuits, which are connected to receive the first, second, third, and fourth sense currents. The second and fourth resistors are coupled in parallel, and a voltage across them represents the average of the output currents of the first and second power transistors. The first and second regulation circuits in this configuration also contain multiple amplifiers with inputs coupled to receive various combinations of voltages and soft start voltages, similar to the configurations described earlier.

Further disclosed herein is an electronic device that features an input voltage node and a load node, along with three integrated circuits. The first integrated circuit includes a first power transistor connected between the input voltage node and the load node, and a first regulation circuit that generates a first sense current, representative of the output current of the first power transistor. Similarly, the second and third integrated circuits each contain a power transistor connected between the input voltage node and the load node, and a regulation circuit generating a sense current representing their respective output currents.

The regulation circuits have specific configurations: the first regulation circuit causes the first power transistor to decrease its output current when the first sense current is greater than the third sense current and increase its output current when the first sense current is less than the third sense current. The second regulation circuit operates in a similar manner, decreasing or increasing the output current of the second power transistor based on the relationship between the second and first sense currents. The third regulation circuit follows suit, adjusting the output current of the third power transistor based on the comparison between the third and second sense currents.

In addition to the integrated circuits, the electronic device includes external first, second, and third resistors. These resistors receive their respective sense currents, with voltages formed across them representing the output current of the corresponding power transistors. The first, second, and third regulation circuits each contain a pair of amplifiers with specific configurations that contribute to driving the control terminals of their respective power transistors. These regulation circuits also include resistor ladders coupled between the output of their respective amplifiers and a reference voltage.

The electronic device may also have a version where the first, second, and third resistors are located within their respective integrated circuits. In this configuration, the regulation circuits still feature pairs of amplifiers and maintain similar functions as previously described, driving the control terminals of their respective power transistors.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Please note that in the following description, any mentioned resistor or resistance is not a simple electrical lead between two points. Therefore, any resistor or resistance connected between two points will have a higher resistance than a lead between those two points. Thus, such a resistor or resistance cannot be interpreted as a lead, and a lead in a prior art reference cannot be interpreted to be a resistor in this disclosure. Similarly, any mentioned capacitor or capacitance is not a parasitic element. Thus, such a capacitor or capacitance cannot be interpreted as a parasitic capacitance, and a parasitic capacitance in a prior art reference cannot be interpreted to be a capacitor of this disclosure. Also, any mentioned inductor or inductance is not a parasitic element. Thus, such an inductor or inductance cannot be interpreted as a parasitic inductance, and a parasitic inductance in a prior art reference cannot be interpreted to be an inductor of this disclosure.

Moreover, unless explicitly stated otherwise, any present resistor may have the same resistance as one or more other resistors present, or it may have a different resistance. Similarly, unless explicitly stated otherwise, any present capacitor may have the same capacitance as one or more other capacitors present, or it may have a different capacitance. Furthermore, unless explicitly stated otherwise, any present current source may generate an output current that is equal to the output current generated by one or more other current sources present, or it may generate an output current with a different value.

Figure 1:
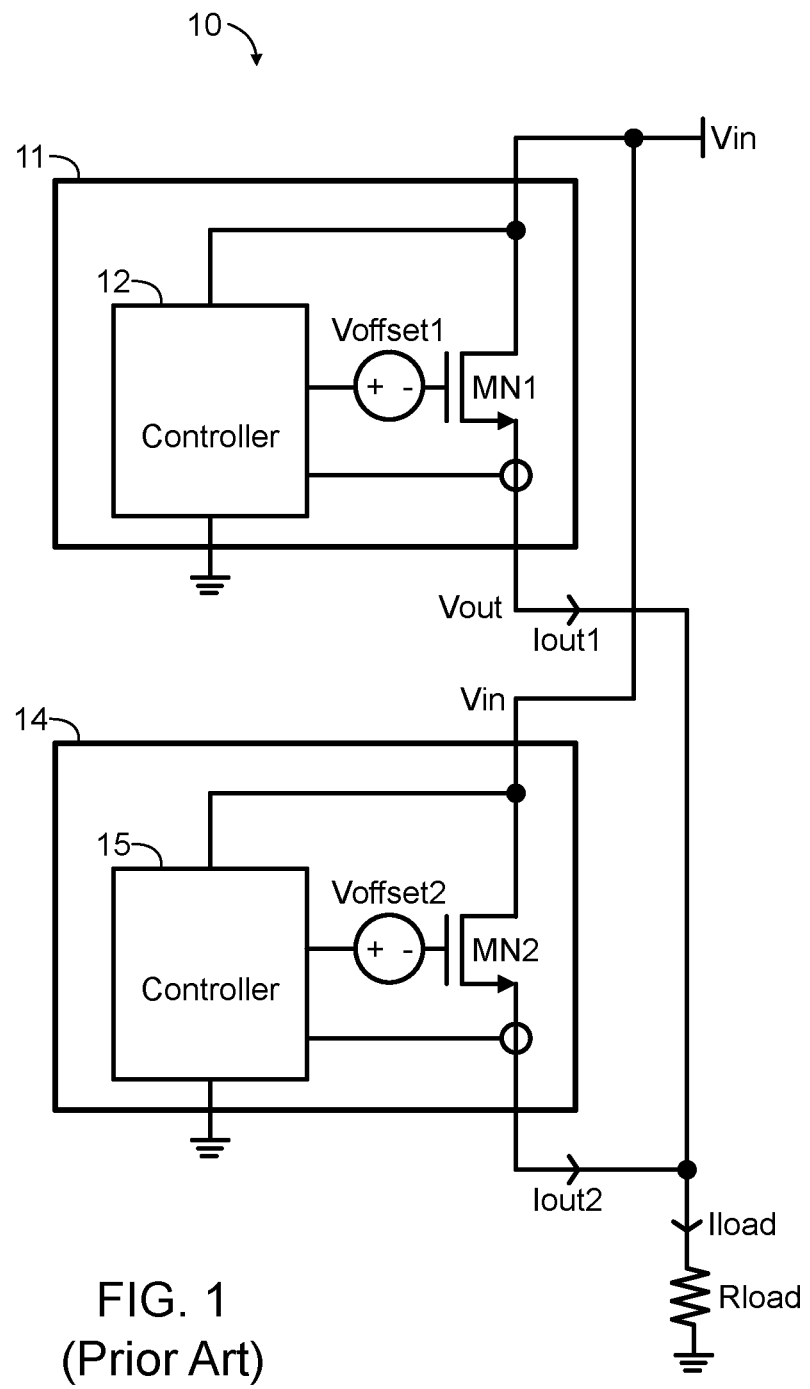
FIG. 1 is a block diagram of a prior art electronic device including two power ICs supplied in parallel.
Figure 2:
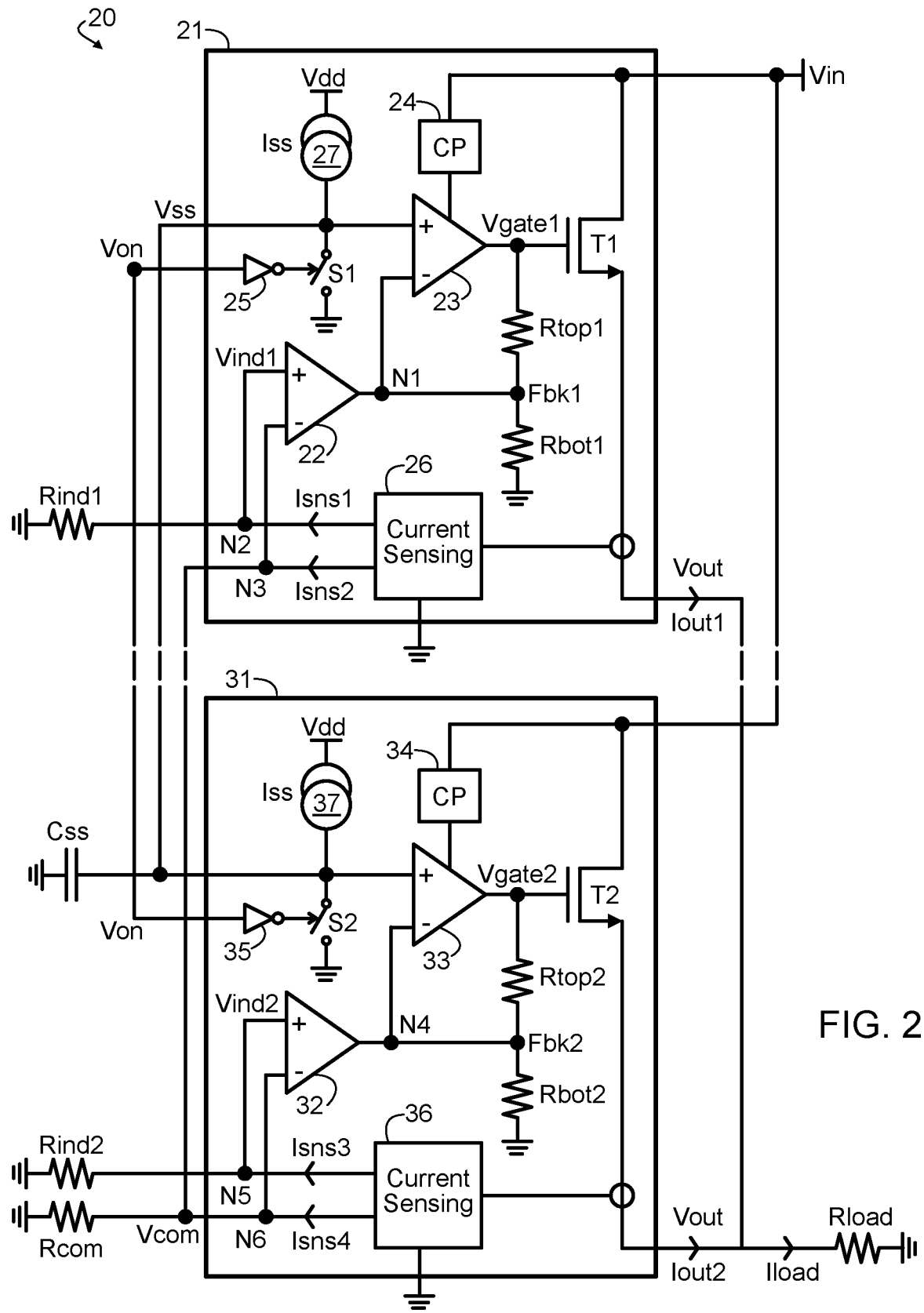
FIG. 2 is a schematic diagram of an electronic device including multiple power ICs supplied in parallel, with load balancing circuitry ensuring current through the power ICs is balanced, as disclosed herein.

Now described herein with reference to FIG. 2 is an electronic device 20 including a first power integrated circuit (IC) 21 and a second power IC (31).

The first power IC 21 includes an n-channel MOS T1 having its drain connected to an input node to receive input voltage Vin, its source connected to the load (represented as resistor Rload), and its gate controlled by the output of an operational amplifier 23. The amplifier 23 is powered between the output of a charge pump 24 that boosts the input voltage Vin and ground, has its non-inverting input terminal connected to soft-start capacitor Css, and has its inverting input terminal connected to node N1. A current source 27 generating a current Iss is connected between Vdd and the non-inverting input terminal of the amplifier 23 and a switch S1 is connected between the non-inverting input terminal of the amplifier 23 and ground. The switch S1 is controlled by the inverse of a control signal Von provided by an inverter 25. A resistor Rtop1 is connected between the output of the amplifier 23 and node N1 and a resistor Rbot1 is connected between node N1 and ground. An operational transconductance amplifier 22 has its output connected to node N1, has its non-inverting input terminal connected to node N2, and has its inverting input terminal connected to node N3. An independent resistor Rind1 (external to and associated with the first power IC 21) is connected between node N2 and ground. A current sensing circuit 26 senses the current Iout1 sourced from the source of MOS transistor T1, sources a first sense current Isns1 to node N2 based upon the sensed current Iout1, and sources a second sense current Isns2 to node N3 based upon the sensed current Iout1. The sense currents Isns1 and Isns2 are equal. A resistor Rcom (external to all power ICs) is connected between node N3 and ground.

The second power IC 31 includes an n-channel MOS T2 having its drain connected to an input node to receive input voltage Vin, its source connected to the load (represented as resistor Rload), and its gate controlled by the output of operational amplifier 33. The amplifier 33 is powered between the output of a charge pump 34 that boosts the input voltage Vin and ground, has its non-inverting input terminal connected to soft-start capacitor Css, and has its inverting input terminal connected to node N4. A current source 37 generating a current Iss is connected between Vdd and the non-inverting input terminal of the amplifier 33 and a switch S2 is connected between the non-inverting input terminal of the amplifier 33 and ground. The switch S2 is controlled by the inverse of a control signal Von provided by an inverter 35. A resistor Rtop2 is connected between the output of the amplifier 33 and node N4 and a resistor Rbot2 is connected between node N4 and ground. An operational transconductance amplifier 32 has its output connected to node N4, has its non-inverting input terminal connected to node N5, and has its inverting input terminal connected to node N6. A resistor Rind2 (external to and associated with the second power IC 31) is connected between node N5 and ground. A current sensing circuit 36 senses the current Iout2 sourced from the source of MOS transistor T2, sources a third sense current Isns3 based upon the current Iout2 to node N5, and sources a fourth sense current Isns4 based upon the current Iout2 to node N6. The sense currents Isns3 and Isns4 are equal.

It should be understood that there may be any number of power ICs (e.g., 3, 4, 5, etc) connected in parallel with the power ICs 21 and 31, each having the same arrangement as the power ICs 21 and 31. The two power ICs 21 and 31 are shown and described herein for ease of description and for the sake of brevity. The independent resistors Rin1 and Rind2 are equal in resistance (for example, Rind), while the resistance of Rcom is equal to Rind/N, with N being the number of power ICs connected in parallel.

Figure 3:
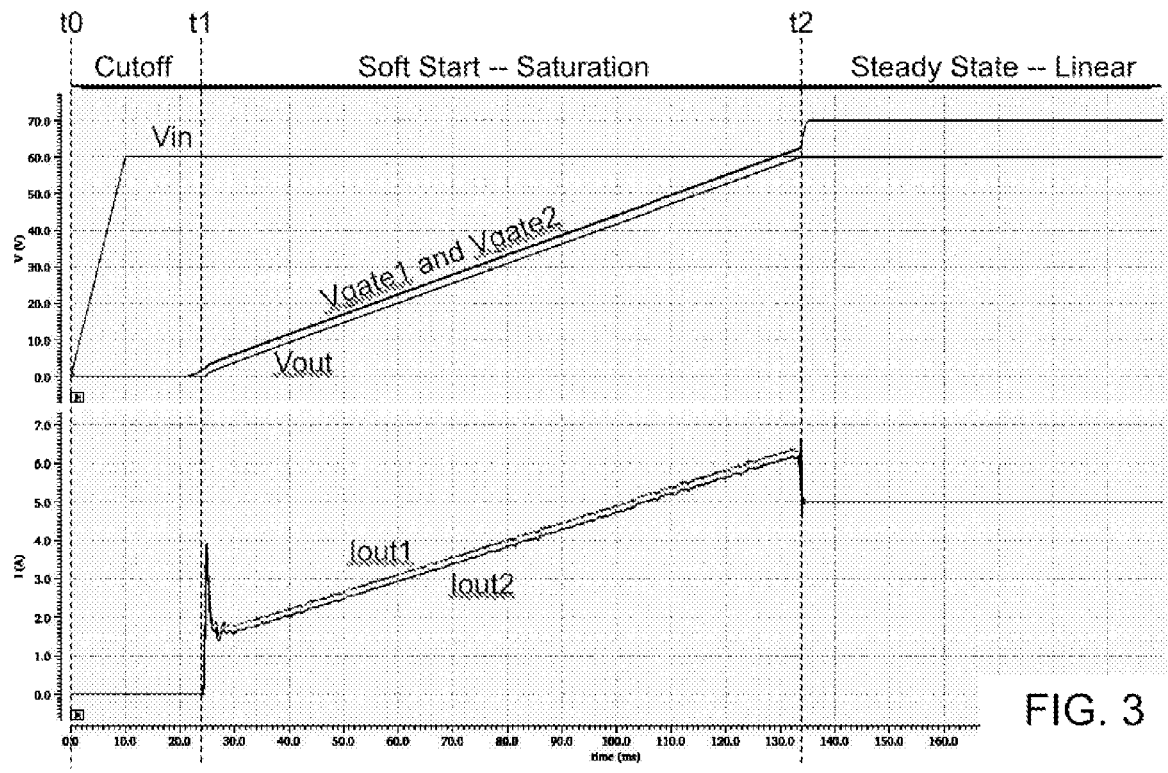
FIG. 3 is a graph of voltage and current values of the device of FIG. 2 during operation.

Operation is now described with additional reference to FIG. 3. The MOS transistors T1 and T2 are intended to function as source followers, in the linear mode of operation, with their output voltages following their input voltages with approximately a unity gain. Initially, the electronic device 20 is off, as reflected by the input voltage Vin, output voltage Vout, and gate voltages of MOSs T1 and T2 being at zero at time t0. To avoid excessive inrush currents and protect the components of the power ICs 21 and 31, a "soft start" of the transistors T1 and T2 is performed beginning at time t1 (and ultimately ending at time t2).

The soft start begins with assertion of the control signal Von, opening the switches S1 and S2, with the result being that the soft start currents Iss output by the current sources 27 and 37 charge the soft start capacitor Css, causing the formation and increase of a soft start voltage Vss across the soft-start capacitor Css. At this point, the feedback voltage Fbk1 formed at the non-inverting terminal will be less than the soft-start voltage Vss, so the operational amplifier 23 increases its output voltage, which is the gate voltage Vgate1 applied to the gate of MOS transistor T1; likewise, the feedback voltage Fbk2 formed at the non-inverting terminal of operational amplifier 33 will be less than the soft-start voltage Vss, so the operational amplifier 33 increases its output voltage, which is the gate voltage Vgate2 applied to the gate of MOS transistor T2. As the soft start currents Iss continue to charge the soft start capacitor Css, the soft start voltage Vss continues to increase, and in turn the operational amplifiers 23 and 33 increase the gate voltages Vgate1 and Vgate2 accordingly.

The effect of this operation is that the gate voltages Vgate1 and Vgate2 ramp upwardly between times t1 and t2, with the MOS transistors T1 and T2 operating in the saturation mode of operation. The output currents Iout1 and Iout2 ramp upward accordingly between times t1 and t2. During this soft start period between times t1 and t2, since the transistors T1 and T2 are operating in saturation, there could be a concern with thermal runaway due to mismatched characteristics between the power ICs 21 and 31. Current balancing is performed to reduce or eliminate this risk.

The current balancing is performed as follows. In the power IC 21, the current sensing circuit 26 senses the output current Iout1 sourced from the MOS transistor T1 and generates two sense currents Isns1 and Isns2 that are representative of the output current Iout1 and equal to one another. The current Isns1 flows through the independent resistor Rind1 associated with the power IC 21, generating voltage Vind1. Similarly, in the power IC 22, the current sensing circuit 36 senses the output current Iout2 sourced from the MOS transistor T2 and generates two sense currents Isns3 and Isns4 that are representative of the output current Iout2 and equal to one another. The current Isns3 flows through the independent resistor Rind2 associated with the power IC 31, generating voltage Vind2. The currents Isns2 and Isns4 both flow through the common resistor Rcom to ground, generating voltage Vcom, which is representative of the average of the output currents Iout1 and Iout2.

Since independent resistors Rin1 and Rind2 are equal in resistance (for example, Rind), while the resistance of Rcom is equal to Rind/2, it follows then that Rcom=Rind/2, and the voltage across Rcom will be:

$$V{com} = (Isns2 + Isns4)\frac{Rind}{2}$$

The voltage Vind1 across Rind1, representative of the output current Iout1 will be:

$$Vind1 = Isns1 \times Rind1 = Isns1 \times Rind$$

The voltage Vind2 across Rind2, representative of the output current Iout2 will then be:

$$Vind2 = Isns3 \times Rind2 = Isns3 \times Rind$$

Ideally, the power ICs 21 and 31 are sourcing their output currents Iout1 and Iout2 as being equal, and therefore, ideally, the sense currents Isns1, Isns2, Isns3, and Isns4 are equal. This means that, ideally, the voltages across Rind1, Rind2, and Rcom are equal.

In the power IC 21, if the voltage Vind1 (representative of Iout1) is greater than the voltage Vcom (representative of the average of Iout1 and Iout2), the OTA 22 sources a current to node N1, increasing the voltage at the inverting input terminal of the operational amplifier 23, thereby decreasing rate of rise of the output voltage Vgate1, in turn decreasing the rate of rise of the output current Iout1. Conversely, if the voltage Vind1 is less than the voltage Vcom, the OTA 22 reduces the current to (or sinks current from) node N1, decreasing the voltage at the inverting input terminal of the operational amplifier 23, thereby increasing rate of rise of the output voltage Vgate1, in turn increasing the rate of rise of the output current Iout1. In summary therefore, the arrangement of the OTA 22 functions so that if Isns1 (representative of Iout1) is greater than (Isns2+Isns4)/2, Iout1 is reduced, but if Isns1 is less than (Isns2+Isns4)/2, Iout1 is increased.

In the power IC 31, if the voltage Vind2 (representative of Iout2) is greater than the voltage Vcom (representative of the average of Iout1 and Iout2), the OTA 32 sources a current to node N4, increasing the voltage at the inverting input terminal of the operational amplifier 33, thereby decreasing rate of rise of the output voltage Vgate2, in turn decreasing the rate of rise of the output current Iout2. Conversely, if the voltage Vind2 is less than the voltage Vcom, the OTA 32 reduces the current to (or sinks current from) node N4, decreasing the voltage at the inverting input terminal of the operational amplifier 33, thereby increasing rate of rise of the output voltage Vgate2, in turn increasing the rate of rise of the output current Iout2. In summary therefore, the arrangement of the OTA 32 functions so that if Isns3 (representative of Iout2) is greater than the average current from all power ICs, Iout2 is reduced, but if Isns3 is less than the average current from all power ICs, Iout2 is increased.

By virtue of this current balancing operation, the output currents Iout1 and Iout2 are nearly identical during the soft start phase between times t1 and t2, as observed in FIG. 3.

At time t2, Vin and Vout become equal and steady-state operation begins. In steady-state, the operational amplifier 23 goes into open loop and ceases to influence Vgate, and as a result transistors T1 and T2 enter the linear mode of operation and concerns of thermal runaway are no longer present.

Figure 4:
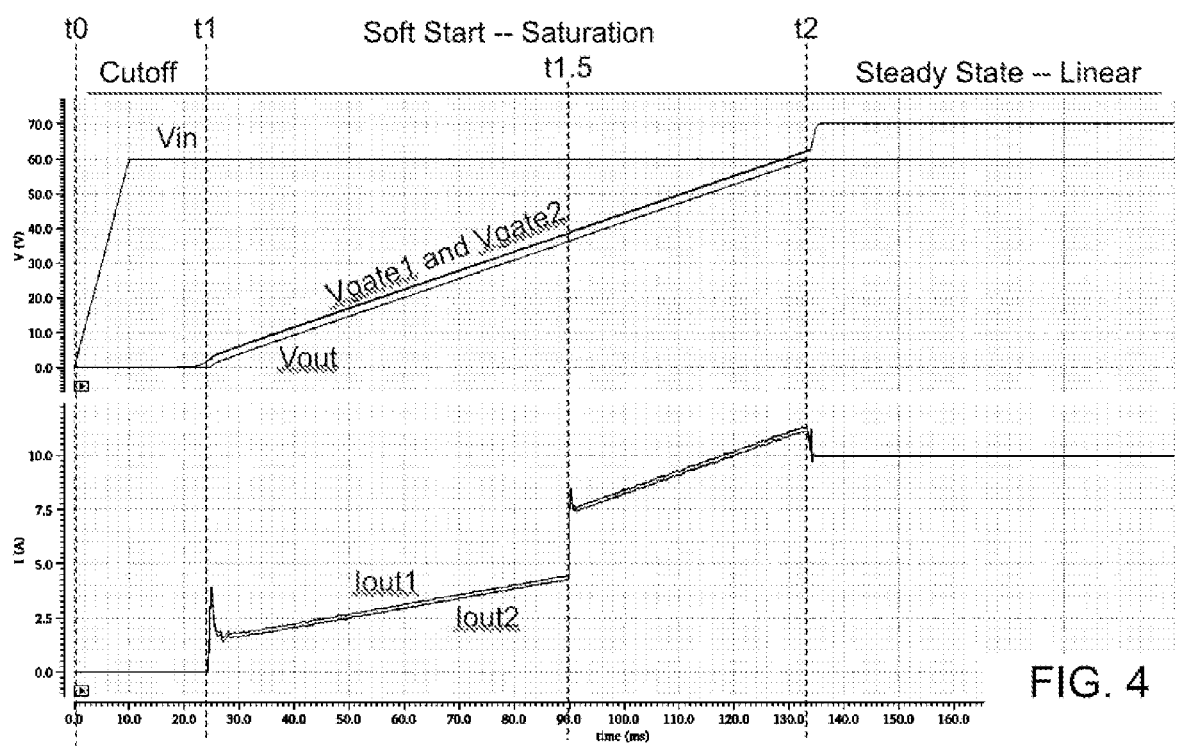
FIG. 4 is a graph of voltage and current values of the device of FIG. 2 during operation in which a load step occurs.

Shown in FIG. 4 is a similar example of operation, but where a load step occurs at time t1.5, between times t1 and t2 during the soft startup. In the specific illustrated example, at time t1.5, the resistance Rload of the load abruptly increases, however, as can be observed, in FIG. 4, as a result of the load step, a visible step in the output voltage Vout does not occur. This demonstrates that the load balancing does not influence Vout.

Figure 5:
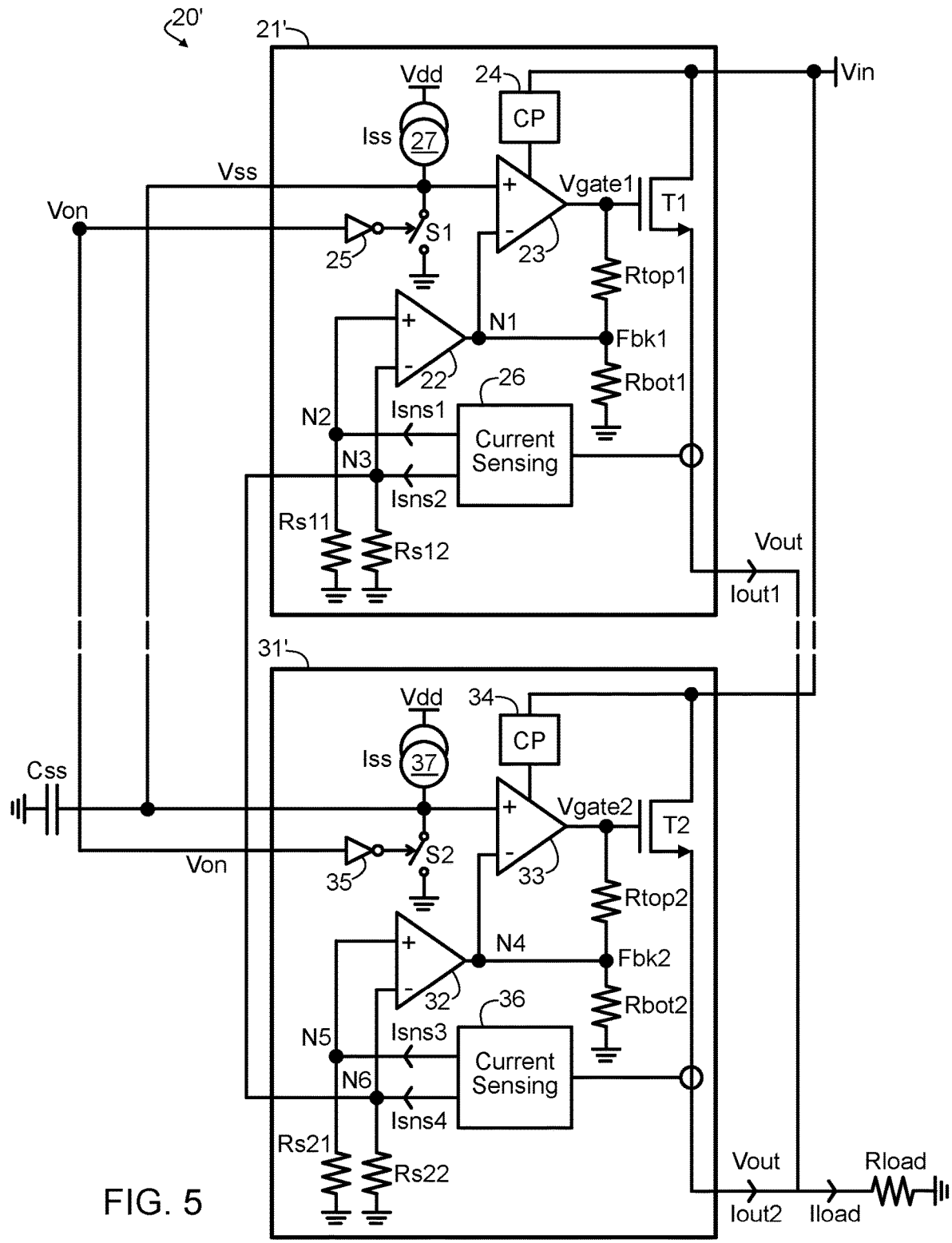
FIG. 5 is an alternative embodiment similar to that of FIG. 2, but with the independent and common resistors being on-chip as opposed to being external.

In the above example of FIG. 2, the independent resistors Rind1 and Rind2 are external to the power ICs 21 and 31, as is the common resistor Rcom. In some applications, the use of external resistors may be undesirable. An embodiment of the electronic device 20' shown in FIG. 5 lacks the external resistors. Instead of the independent resistor Rind1 being present external to the power IC 21', a resistor Rs11 within the power IC 21' is connected between the non-inverting input terminal of the OTA 22 and ground, and instead of the independent resistor Rind2 being present external to the power IC 31', a resistor Rs21 is connected between the non-inverting input terminal of the OTA 32 and ground. Instead of the single common resistor, the power IC 21' includes therein a resistor Rs12 connected between the inverting input terminal of the OTA 22 and ground, the power IC 31' includes therein a resistor Rs22 connected between the inverting input terminal of the OTA 32 and ground, and these resistors Rs12 and Rs22 are connected in parallel with one another. Resistors Rs11, Rs21, Rs12, and Rs22 are equal in resistance.

Operation in this example proceeds as described above with respect to FIG. 2, with resistors Rs11 and Rs21 corresponding to independent resistors Rind1 and Rind2 in terms of operation, and with resistors R12 and R22 in parallel corresponding to common resistor Rcom in terms of operation.

Figure 6:
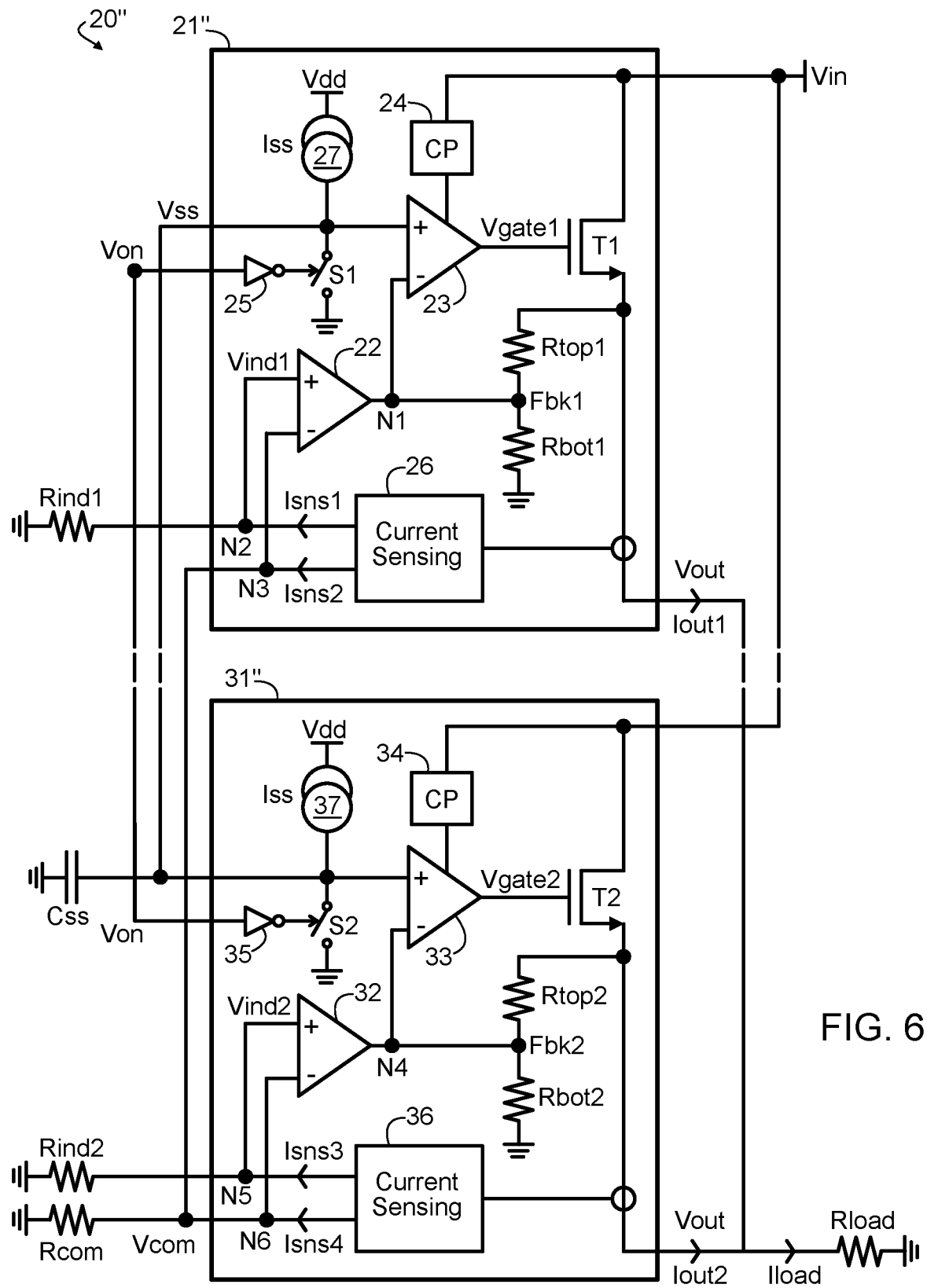
FIG. 6 is an alternative embodiment similar to that of FIG. 2, but with the feedback resistors being connected between the output node and ground instead of between the gate nodes and ground.

In another example embodiment, the independent resistors Rind1, Rind2 and the common resistor Rcom remain are they are in FIG. 2, however the feedback point for the operational amplifiers 23 and 33 changes, as shown in FIG. 6. Here, in the power IC 21", the resistors Rtop1, Rbot1 are connected in series between the source of MOS T1 and ground, with the inverting input terminal of the operational amplifier 23 being connected to the tap between Rtop1, Rtop1. Likewise, in the power IC 31", the resistors Rtop2, Rbot2 are connected in series between the source of MOS T2 and ground, with the inverting input terminal of the operational amplifier 33 being connected to the tap between Rtop2, Rbot2.

Operation of this embodiment is effectively the same as the embodiment of FIG. 2, with the difference being that by taking the feedback from the source of the MOS transistors T1 and T2, the regulation performed by the operational amplifiers 23 and 33 is based upon the source voltages of T1 and T2 and not their gate voltages. This may produce a more accurate slow start, as the gate to source voltages of T1 and T2 are now strictly controlled. Regardless, the operation of the current balancing remains the same.

Figure 7:
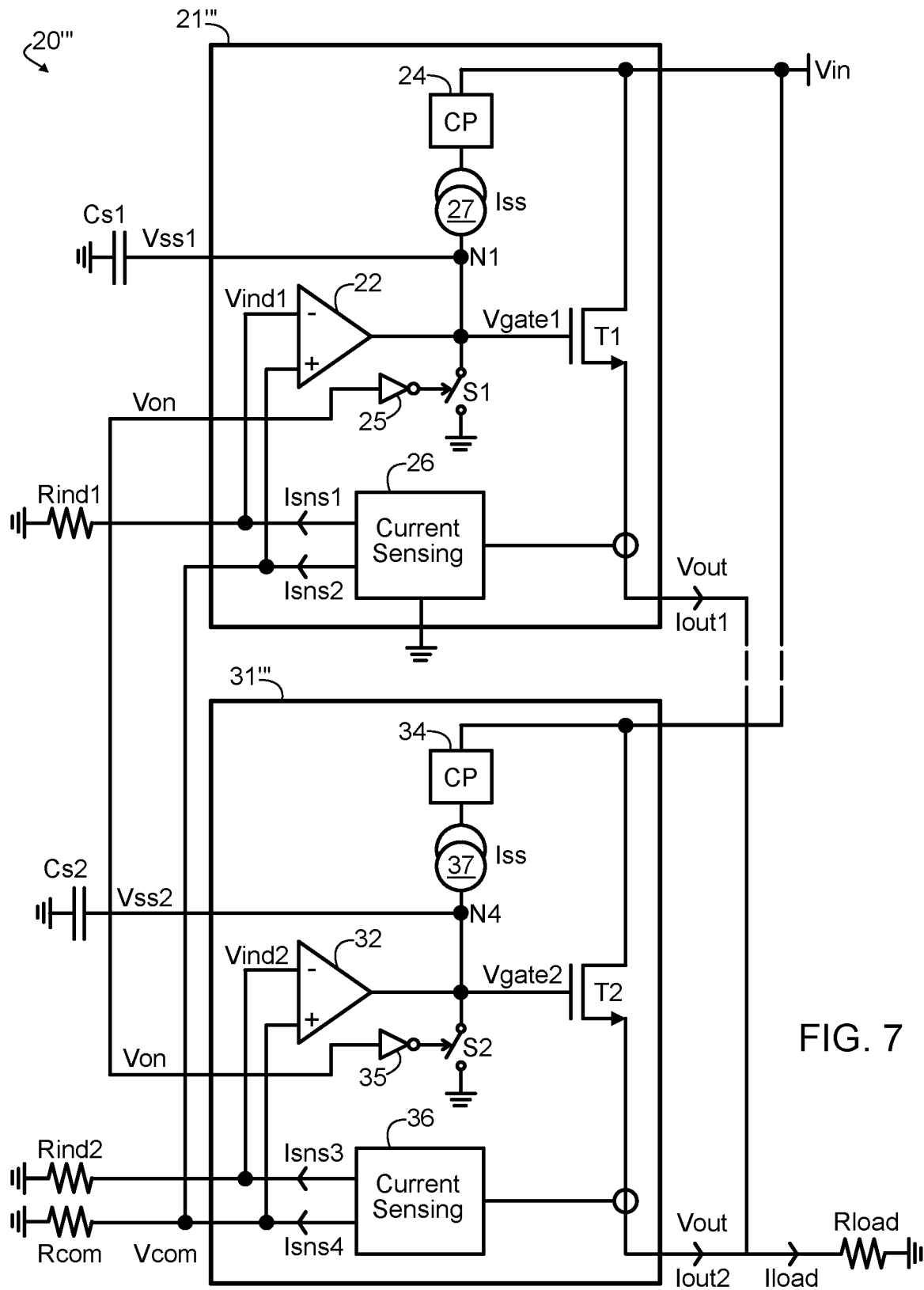
FIG. 7 is an alternative embodiment similar to that of FIG. 2, but with the operational amplifiers having been removed and the soft start ramp generated at the gate during startup as a mean of constant current and capacitance.

In a further example embodiment shown in FIG. 7, the independent resistors Rind1, Rind2 and the common resistor Rcom remain are they are in FIG. 2, however the operational amplifiers 23 and 33 are removed from the power ICs 21''' and 31'''. Instead, in the power IC 21''', the current source 27 is connected between the charge pump 24 and the gate of MOS T1, the switch S1 is connected between the gate of MOS T1 and ground, and the output of OTA 22 is connected to the gate of MOS T1. In addition, a soft start capacitor Css1, external to the power IC 21''', is connected between the gate of MOS T1 and ground. Similarly, in the power IC 31''', the current source 37 is connected between the charge pump 34 and the gate of MOS T2, the switch S2 is connected between the gate of MOS T2 and ground, and the output of OTA 32 is connected to the gate of MOS T2. In addition, a soft start capacitor Cs2, external to the power IC 31''', is connected between the gate of MOS T2 and ground. Further note that here, the polarity of the inputs of the OTAs 22 and 32 are reversed; the inverting input of OTA 22 is coupled to receive the voltage Vind1 and the non-inverting input of OTA 22 is coupled to receive the voltage Vcom, while the inverting input of OTA 32 is coupled to receive the voltage Vind2 and the non-inverting input of OTA 32 is coupled to receive the voltage Vcom.

Operation of this embodiment proceeds as follows. At startup, once the input voltage Vin reaches its steady state value, the signal Von is asserted, opening switches S1 and S2. As a result, the soft start currents Iss begin to charge the soft start capacitors Cs1 and Cs2 to soft start voltages Vss1 and Vss2. Here, the soft start voltages Vss1 and Vss2 act as the gate voltages Vgate1 and Vgate2, so as the soft start voltages Vss1 and Vss2 ramp upward, the gate voltages Vgate1 and Vgate2 ramp upward.

As with the above embodiment of FIG. 2, the current sensing circuits 26 and 36 compare the voltages Vind1 and Vind2 formed across the independent resistors Rind1 and Rind2 to the voltage Vcom formed across the common resistor Rcom. Here though, if Vind1 (representative of the output current Iout1) is greater than Vcom, the amplifier 22 decreases its output current to (or sinks current from) node N1, decreasing the ramp rate of the gate voltage Vgate1; if Vind1 is less than Vcom, the amplifier 22 increases its output current to node N1, increasing the ramp rate of the gate voltage Vgate1. Likewise, if Vind2 (representative of the output current Iout2) is greater than Vcom, the amplifier 32 decreases its output current to (or sinks current from) node N4, decreasing the ramp rate of the gate voltage Vgate2; if Vind2 is less than Vcom, the amplifier 32 increases its output current to node N4, increasing the ramp rate of the gate voltage Vgate2. As a result, the gate voltages Vgate1 and Vgate2 track one another during soft start and the output currents Iout1 and Iout2 likewise track one another during soft start. Therefore, this embodiment effectively performs the same current balancing as described above.

Figure 8:
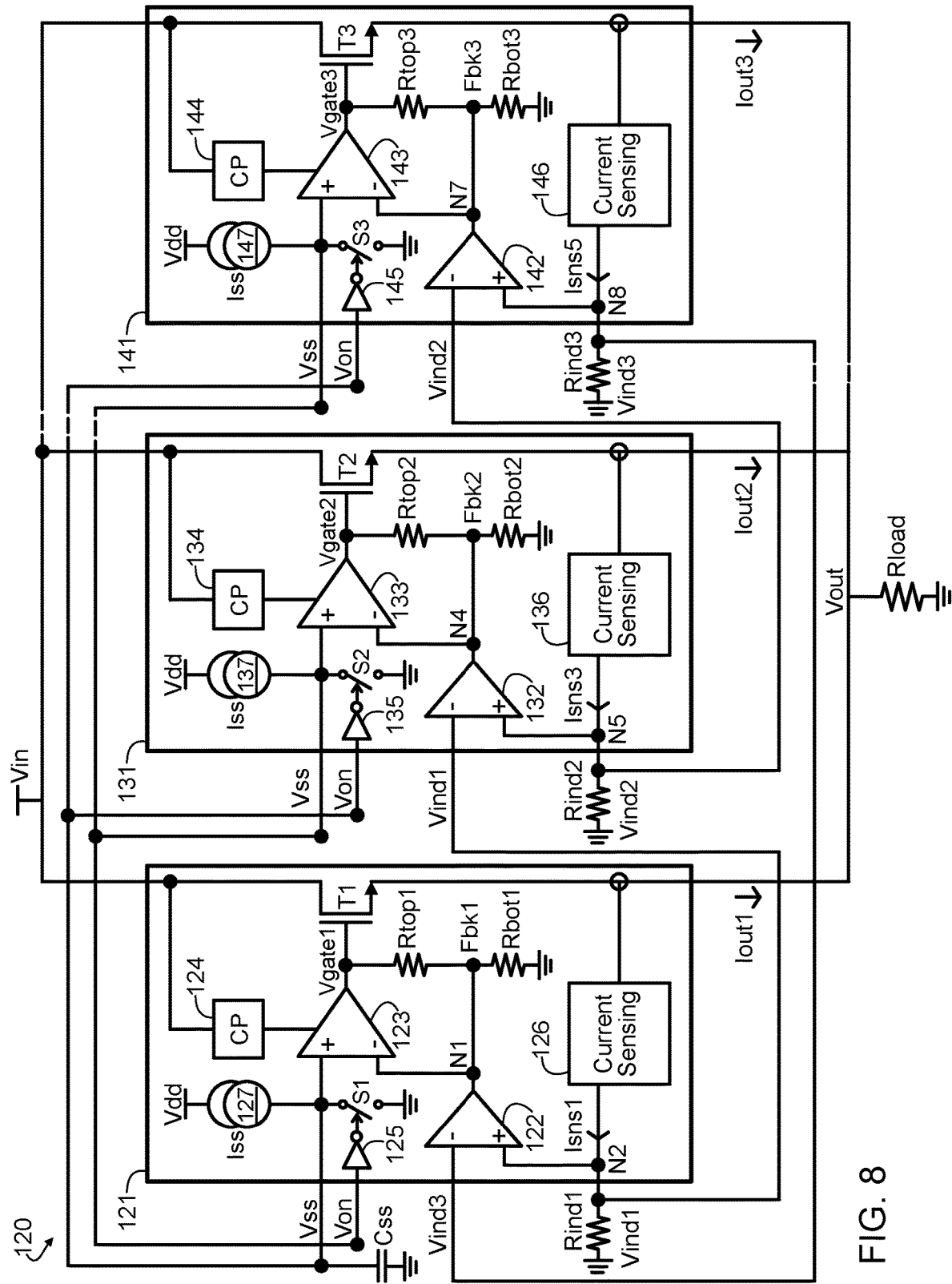
FIG. 8 is a schematic diagram of an electronic device including multiple power ICs supplied in parallel, with daisy chained load balancing circuitry ensuring current through the power ICs is balanced, as disclosed herein.

It is possible to remove the common resistor Rcom entirely by daisy chaining the power ICs together, as shown in FIG. 8. Recall above that it was stated there may be any number of power ICs in the configurations shown above. In the example device 120 of FIG. 8, three power ICs 121, 131, and 141 are shown, but any number of power ICs so arranged may be present. The common resistor, as stated, has been removed, but otherwise the power ICs 121, 131, and 141 themselves are the same as described above with reference to FIG. 2, with the exception being the connections to the inverting input terminals of the OTAs 122, 132, and 142. Note that the soft start capacitor Css connected in parallel between the non-inverting input terminals of the amplifiers 123, 133, and 143 and ground may represent different separate independent soft start capacitors respectively connected between the non-inverting input terminals of each of the amplifiers 123, 133, and 143 and ground.

The connection arrangement for the OTAs 122, 132, and 142 is as follows. The non-inverting input terminal of OTA 122 is connected to node N2 to receive the voltage Vind1 formed across the independent resistor Rind1 while the inverting input terminal of OTA 122 is connected to node N8 to receive the voltage Vind3 formed across the independent resistor Rind3. The non-inverting input terminal of OTA 132 is connected to node N5 to receive the voltage Vind2 formed across the independent resistor Rind2 while the inverting input terminal of OTA 132 is connected to node N2 to receive the voltage Vind1 formed across the independent resistor Rind1. The non-inverting input terminal of OTA 142 is connected to node N8 to receive the voltage Vind3 formed across the independent resistor Rind3 while the inverting input terminal of OTA 142 is connected to node N5 to receive the voltage Vind2 formed across the independent resistor Rind2.

Operation is therefore as follows. At the beginning of the soft start and operation of the transistors T1, T2, and T3 in saturation, the signal Von is asserted to open switches S1, S2, and S3, causing the currents Iss to begin to charge the soft start capacitor Css and start to ramp the soft start voltage Vss upwardly. At this point therefore, Vss is greater than the voltages at nodes N1, N4, and N7, so the operational amplifiers 123, 133, and 143 begin to ramp the values of the gate voltages Vgate1, Vgate2, and Vgate3 upwardly, causing the output currents Iout1, Iout2, and Iout3 to ramp upwardly in value until the output voltage Vout becomes equal to the input voltage Vin and steady state operation with the transistors T1, T2, and T3 in linear mode is begun.

During the soft start operation, current balancing is performed as follows. In the power IC 121, if the independent voltage Vind1 (representative of the current Iout1) is greater than the independent voltage Vind3 (representative of the current Iout3), the OTA 122 sources current to node N1, applying a positive bias at the inverting input terminal of the operational amplifier 123 to thereby reduce the voltage Vgate1 (or reduce its slope as it ramps upwardly); conversely, if the independent voltage Vind1 is less than the independent voltage Vind3, the OTA 122 sinks current from node N1, applying a negative bias at the inverting input terminal of the operational amplifier 123 to thereby increase the voltage Vgate1 (or increase its slope as it ramps upwardly).

In the power IC 131, if the independent voltage Vind2 (representative of the current Iout2) is greater than the independent voltage Vind1 (representative of the current Iout1), the OTA 132 sources current to node N4, applying a positive bias at the inverting input terminal of the operational amplifier 133 to thereby reduce the voltage Vgate2 (or reduce its slope as it ramps upwardly); conversely, if the independent voltage Vind2 is less than the independent voltage Vind1, the OTA 132 sinks current from node N4, applying a negative bias at the inverting input terminal of the operational amplifier 133 to thereby increase the voltage Vgate2 (or increase its slope as it ramps upwardly).

In the power IC 141, if the independent voltage Vind3 (representative of the current Iout3) is greater than the independent voltage Vind2 (representative of the current Iout2), the OTA 142 sources current to node N7, applying a positive bias at the inverting input terminal of the operational amplifier 143 to thereby reduce the voltage Vgate3 (or reduce its slope as it ramps upwardly); conversely, if the independent voltage Vind3 is less than the independent voltage Vind2, the OTA 142 sinks current from node N7, applying a negative bias at the inverting input terminal of the operational amplifier 143 to thereby increase the voltage Vgate3 (or increase its slope as it ramps upwardly).

Through this action, the power IC 121 adjusts its output current Iout1 to be equal to the output current Iout3, the power IC 131 adjusts its output current Iout2 to be equal to the output current Iout1, and the power IC 141 adjusts its output current Iout3 to be equal to the output current Iout2. The result is the output currents Iout1, Iout2, and Iout3 are equal as are Vgate1, Vgate2, and Vgate3

Figure 9:
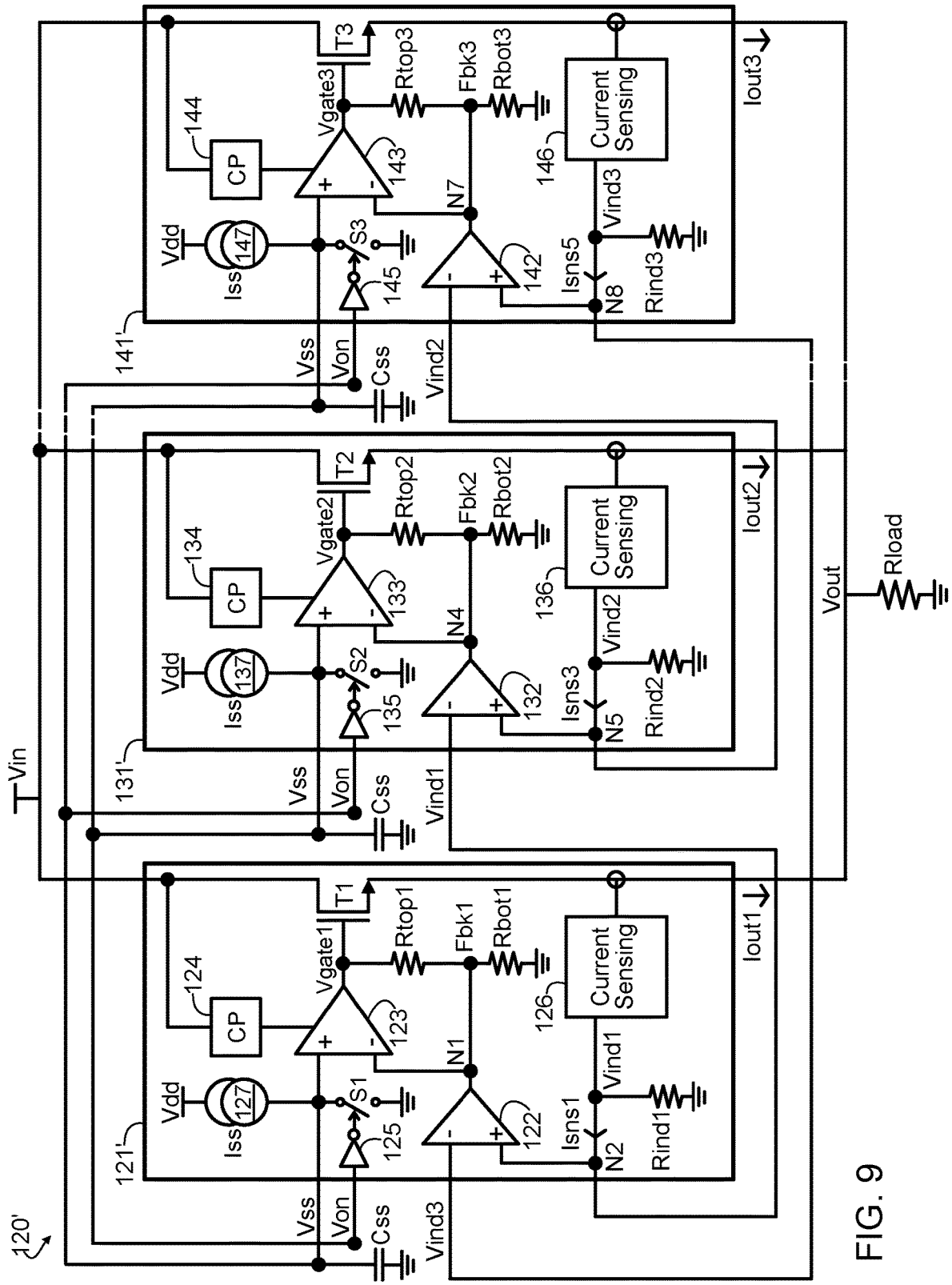
FIG. 9 is an alternative embodiment similar to that of FIG. 8, but with the independent resistors being on-chip as opposed to being external.

In another daisy-chained configuration, the external independent resistors Rind1, Rind2, and Rind3 may instead be located within their associated power ICs 121, 131, and 141, as shown in FIG. 9. Operation remains the same as the configuration of FIG. 8.

Figure 10:
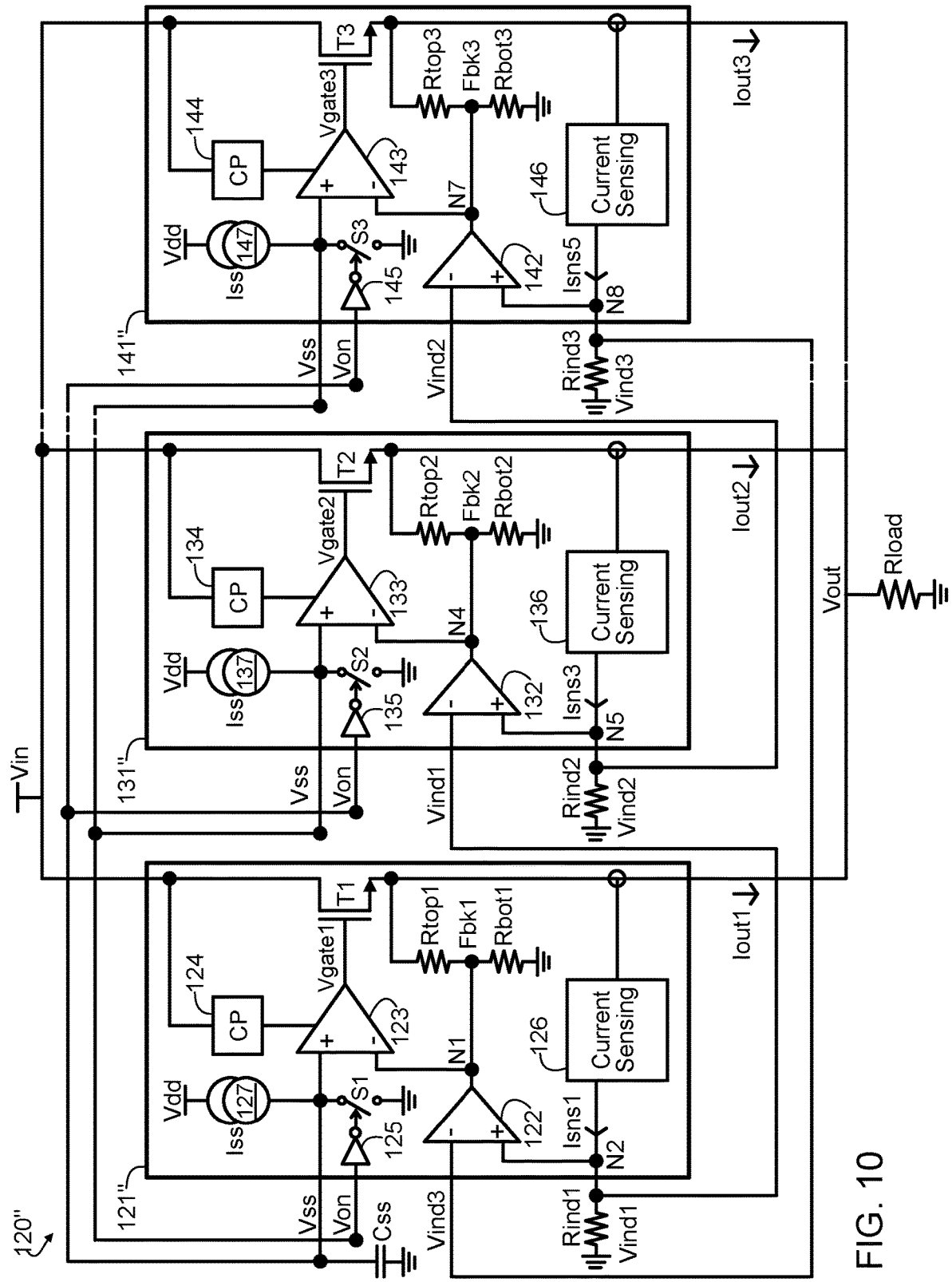
FIG. 10 is an alternative embodiment similar to that of FIG. 8, but with the feedback resistors being connected between the output node and ground instead of between the gate nodes and ground.

In yet another daisy chained configuration shown in FIG. 10, the resistors Rtop1 and Rbot1 are connected in series between the source of transistor T1 and ground, the resistors Rtop2 and Rbot2 are connected in series between the source of transistor T2 and ground, and the resistors Rtop3 and Rbot3 are connected in series between the source of transistor T3 and ground.

Operation of this embodiment is effectively the same as the embodiment of FIG. 8, with the difference being that by taking the feedback from the source of the MOS transistors T1, T2, and T3, the regulation performed by the operational amplifiers 123, 133, and 143 is based upon the source voltages of T1, T2, and T3 and not their gate voltages. This may produce a more accurate slow start, as the gate to source voltages of T1, T2, and T3 are now strictly controlled. Regardless, the operation of the current balancing remains the same.

Figure 11:
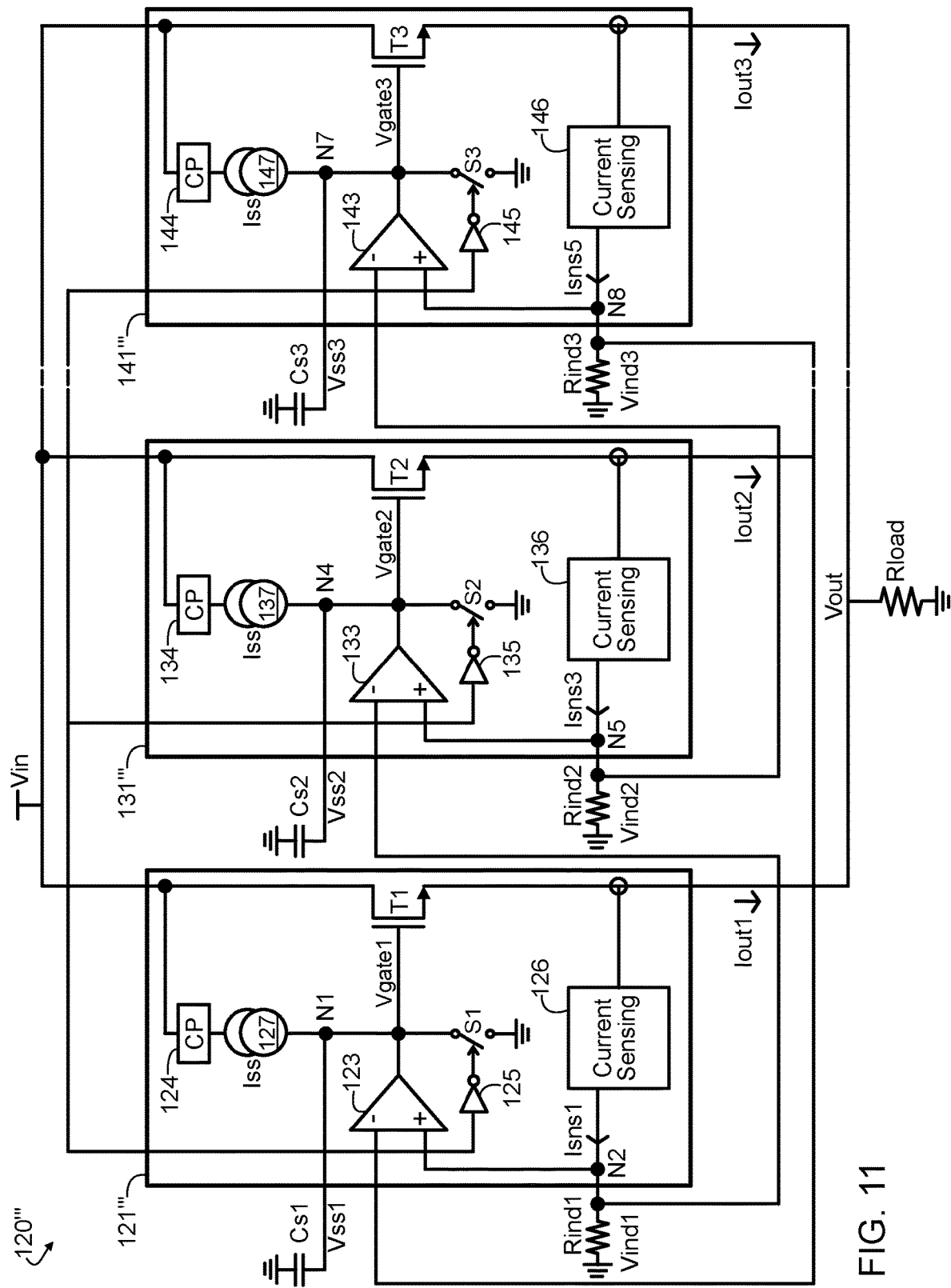
FIG. 11 is an alternative embodiment similar to that of FIG. 8, but with the operational amplifiers having been removed and the soft start ramp generated at the gate during startup as a mean of constant current and capacitance.

In a further example embodiment shown in FIG. 11, the independent resistors Rind1, Rind2, and Rind3 remain are they are in FIG. 8, however the operational amplifiers 123, 133, and 143 are removed from the power ICs 121''', 131''', and 141'''. Instead, in the power IC 121''', the current source 127 is connected between the charge pump 124 and the gate of MOS T1, the switch S1 is connected between the gate of MOS T1 and ground, and the output of OTA 122 is connected to the gate of MOS T1. Soft start capacitor Cs1, external to the power IC 121''', is connected between the gate of MOS T1 and ground. Similarly, in the power IC 131''', the current source 137 is connected between the charge pump 134 and the gate of MOS T2, the switch S2 is connected between the gate of MOS T2 and ground, and the output of OTA 132 is connected to the gate of MOS T2. Soft start capacitor Cs2, external to the power IC 131''', is connected between the gate of MOS T2 and ground. In the power IC 141''', the current source 147 is connected between the charge pump 144 and the gate of MOS T3, the switch S3 is connected between the gate of MOS T3 and ground, and the output of OTA 142 is connected to the gate of MOS T3. Soft start capacitor Cs3, external to the power IC 141''', is connected between the gate of MOS T3 and ground.

Operation of this embodiment proceeds as follows. At startup, once the input voltage Vin reaches its steady state value, the signal Von is asserted, opening switches S1, S2, and S3. As a result, the soft start currents Iss begin to charge the soft start capacitors Cs1, Cs2, and Cs3 to soft start voltages Vss1, Vss2, and Vss3. Here, the soft start voltages Vss1, Vss2, and Vss3 act as the gate voltages Vgate1, Vgate2, and Vgate3 so as the soft start voltages Vss1, Vss2, and Vss3 ramp upward, the gate voltages Vgate1, Vgate2, and Vgate3 ramp upward.

As with the above embodiment of FIG. 8, the current sensing circuits 126, 136, and 146 compare the voltages Vind1, Vind2, and Vind3 to the voltages Vind3, Vind1, and Vind2. If Vind1 (representative of the output current Iout1) is greater than Vind3 the amplifier 123 decreases its output current to node N1, decreasing the ramp rate of the gate voltage Vgate1; if Vind1 is less than Vind3, the amplifier 122 source current to node N1, increasing the ramp rate of the gate voltage Vgate1. If Vind2 (representative of the output current Iout2) is greater than Vind1, the amplifier 132 decreases its output current to node N4, decreasing the ramp rate of the gate voltage Vgate2; if Vind2 is less than Vind1, the amplifier 132 sources current to node N4, increasing the ramp rate of the gate voltage Vgate2. If Vind3 (representative of the output current Iout3) is greater than Vind2, the amplifier 142 decreases its output current to node N7, decreasing the ramp rate of the gate voltage Vgate3; if Vind3 is less than Vind2, the amplifier 142 sources current to node N7, increasing the ramp rate of the gate voltage Vgate3.

As a result, the gate voltages Vgate1, Vgate2, and Vgate3 track one another during soft start and the output currents Iout1, Iout2, and Iout3 likewise track one another during soft start. Therefore, this embodiment effectively performs the same current balancing as described above.

It is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. An electronic device, comprising:
an input voltage node and a load node;
a first integrated circuit including:
 a first power transistor connected between the input voltage node and the load node; and
 a first regulation circuit configured to generate first and second sense currents which are representative of an output current of the first power transistor; and
a second integrated circuit including:
 a second power transistor connected between the input voltage node and the load node; and
 a second regulation circuit configured to generate third and fourth sense currents which are representative of an output current of the second power transistor;
a first resistor external to the first and second integrated circuits and coupled to receive the first sense current such that a first voltage formed across the first resistor is representative of the output current of the first power transistor;
a second resistor external to the first and second integrated circuits and coupled to receive the third sense current such that a second voltage formed across the second resistor is representative of the output current of the second power transistor; and
a third resistor external to the first and second integrated circuits and coupled to receive the second and fourth sense currents such that a third voltage formed across the third resistor is representative of an average of the output currents of the first and second power transistors;
wherein the first regulation circuit comprises:
a first amplifier having inputs coupled to receive the first and third voltages, the first amplifier configured to source current to its output when the first voltage is greater than the third voltage but to sink current from its output when the first voltage is less than the third voltage; and
a second amplifier having inputs coupled to receive a soft start voltage and a voltage generated at the output of the first amplifier, wherein an output of the second amplifier is coupled to drive a control terminal of the first power transistor;
wherein the first regulation circuit is configured to cause the first power transistor to decrease its output current when the first sense current is greater than an average of the second and fourth sense currents;
wherein the first regulation circuit is configured to cause the first power transistor to increase its output current when the first sense current is less than an average of the second and fourth sense currents; and
wherein the second regulation circuit comprises:
a third amplifier having inputs coupled to receive the second and third voltages, the third amplifier configured to source current to its output when the second voltage is greater than the third voltage but to sink current from its output when the second voltage is less than the third voltage; and
a fourth amplifier having inputs coupled to receive a soft start voltage and a voltage generated at the output of the third amplifier, wherein an output of the fourth amplifier is coupled to drive a control terminal of the second power transistor;
wherein the second regulation circuit is configured to cause the second power transistor to decrease its output current when the third sense current is greater than an average of the second and fourth sense currents; and
wherein the second regulation circuit is configured to cause the second power transistor to increase its output current when the third sense current is less than an average of the second and fourth sense currents.

2. The electronic device of claim 1,
wherein the first regulation circuit further comprises a first resistor ladder coupled between the output of the second amplifier and a reference voltage, wherein a tap of the first resistor ladder is coupled to the output of the first amplifier; and
wherein the second regulation circuit further comprises a second resistor ladder coupled between the output of the fourth amplifier and the reference voltage, wherein a tap of the second resistor ladder is coupled to the output of the third amplifier.

3. The electronic device of claim 1,
wherein the first regulation circuit further comprises a first resistor ladder coupled between the output of the first power transistor and a reference voltage, wherein a tap of the first resistor ladder is coupled to the output of the first amplifier; and
wherein the second regulation circuit further comprises a second resistor ladder coupled between the output of the second power transistor and a reference voltage, wherein a tap of the second resistor ladder is coupled to the output of the third amplifier.

4. The electronic device of claim 1,
wherein a control terminal of the first power transistor is coupled to a first soft start voltage and a control terminal of the second power transistor is coupled to a second soft start voltage;
wherein the first regulation circuit comprises a first amplifier having inputs coupled to receive the first and third voltages, the first amplifier configured to sink current from its output when the first voltage is greater than the third voltage but to source current to its output when the first voltage is less than the third voltage, wherein an output of the first amplifier is coupled to drive the control terminal of the first power transistor; and
wherein the second regulation circuit comprises a second amplifier having inputs coupled to receive the second and third voltages, the second amplifier configured to sink current from its output when the second voltage is greater than the third voltage but to source current to its output when the second voltage is less than the third voltage, wherein an output of the second amplifier is coupled to drive the control terminal of the second power transistor.

5. An electronic device, comprising:
an input voltage node and a load node;
a first integrated circuit including:
a first power transistor connected between the input voltage node and the load node;
a first regulation circuit configured to generate first and second sense currents which are representative of an output current of the first power transistor;
a first resistor coupled to receive the first sense current such that a first voltage formed across the first resistor is representative of the output current of the first power transistor; and
a second resistor coupled to receive the second sense current;
a second integrated circuit including:
a second power transistor connected between the input voltage node and the load node;
a second regulation circuit configured to generate third and fourth sense currents which are representative of an output current of the second power transistor;
a third resistor coupled to receive the third sense current such that a second voltage formed across the second resistor is representative of the output current of the second power transistor; and
a fourth resistor coupled to receive the fourth sense current;
wherein the second and fourth resistors are coupled in parallel such that a third voltage formed across the second and fourth resistors is representative of an average of the output currents of the first and second power transistors.

6. The electronic device of claim 5,
wherein the first regulation circuit comprises:
a first amplifier having inputs coupled to receive the first and third voltages, the first amplifier configured to source current to its output when the first voltage is greater than the third voltage but to sink current from its output when the first voltage is less than the third voltage; and
a second amplifier having inputs coupled to receive a soft start voltage and a voltage generated at the output of the first amplifier, wherein an output of the second amplifier is coupled to drive a control terminal of the first power transistor; and wherein the second regulation circuit comprises:
  a third amplifier having inputs coupled to receive the second and third voltages, the third amplifier configured to source current to its output when the second voltage is greater than the third voltage but to sink current from its output when the second voltage is less than the third voltage; and
  a fourth amplifier having inputs coupled to receive a soft start voltage and a voltage generated at the output of the third amplifier, wherein an output of the fourth amplifier is coupled to drive a control terminal of the second power transistor.

7. An electronic device, comprising:
an input voltage node and a load node;
a first integrated circuit including:
  a first power transistor connected between the input voltage node and the load node; and
  a first regulation circuit configured to generate a first sense current which is representative of an output current of the first power transistor; and
a second integrated circuit including:
  a second power transistor connected between the input voltage node and the load node; and
  a second regulation circuit configured to generate a second sense current which is representative of an output current of the second power transistor; and
a third integrated circuit including:
  a third power transistor connected between the input voltage node and the load node; and
  a third regulation circuit configured to generate a third sense current which is representative of an output current of the third power transistor;
a first resistor external to the first, second, and third integrated circuits and coupled to receive the first sense current such that a first voltage formed across the first resistor is representative of the output current of the first power transistor;
a second resistor external to the first, second, and third integrated circuits and coupled to receive the second sense current such that a second voltage formed across the second resistor is representative of the output current of the second power transistor;
a third resistor external to the first, second, and third integrated circuits and coupled to receive the third sense current such that a third voltage formed across the third resistor is representative of the output current of the third power transistor;
wherein the first regulation circuit comprises:
  a first amplifier having inputs coupled to receive the first and third voltages, the first amplifier configured to source current to its output when the first voltage is greater than the third voltage but to sink current from its output when the first voltage is less than the third voltage; and
  a second amplifier having inputs coupled to receive a soft start voltage and a voltage generated at the output of the first amplifier, wherein an output of the second amplifier is coupled to drive a control terminal of the first power transistor; and
wherein the second regulation circuit comprises:
  a third amplifier having inputs coupled to receive the second and first voltages, the third amplifier configured to source current to its output when the second voltage is greater than the first voltage but to sink current from its output when the second voltage is less than the first voltage; and
  a fourth amplifier having inputs coupled to receive a soft start voltage and a voltage generated at the output of the third amplifier, wherein an output of the fourth amplifier is coupled to drive a control terminal of the second power transistor;
wherein the third regulation circuit comprises:
  a fifth amplifier having inputs coupled to receive the third and second voltages, the third amplifier configured to source current to its output when the third voltage is greater than the second voltage but to sink current from its output when the third voltage is less than the second voltage; and
  a sixth amplifier having inputs coupled to receive a soft start voltage and a voltage generated at the output of the fifth amplifier, wherein an output of the fourth amplifier is coupled to drive a control terminal of the third power transistor;
wherein the first regulation circuit is configured to cause the first power transistor to decrease its output current when the first sense current is greater than the third sense current;
wherein the first regulation circuit is configured to cause the first power transistor to increase its output current when the first sense current is less than the third sense current;
wherein the second regulation circuit is configured to cause the second power transistor to decrease its output current when the second sense current is greater than the first sense current;
wherein the second regulation circuit is configured to cause the second power transistor to increase its output current when the second sense current is less than the first sense current;
wherein the third regulation circuit is configured to cause the third power transistor to decrease its output current when the third sense current is greater than the second sense current; and
wherein the third regulation circuit is configured to cause the third power transistor to increase its output current when the third sense current is less than the second sense current.

8. The electronic device of claim 7,
wherein the first regulation circuit further comprises a first resistor ladder coupled between the output of the second amplifier and a reference voltage, wherein a tap of the first resistor ladder is coupled to the output of the first amplifier;
wherein the second regulation circuit further comprises a second resistor ladder coupled between the output of the fourth amplifier and the reference voltage, wherein a tap of the second resistor ladder is coupled to the output of the third amplifier; and
wherein the third regulation circuit further comprises a third resistor ladder coupled between the output of the sixth amplifier and the reference voltage, wherein a tap of the third resistor ladder is coupled to the output of the fifth amplifier.

9. The electronic device of claim 7,
wherein the first regulation circuit further comprises a first resistor ladder coupled between the output of the first power transistor and a reference voltage, wherein a tap of the first resistor ladder is coupled to the output of the first amplifier;
wherein the second regulation circuit further comprises a second resistor ladder coupled between the output of the second power transistor and a reference voltage, wherein a tap of the second resistor ladder is coupled to the output of the third amplifier; and wherein the third regulation circuit further comprises a third resistor ladder coupled between the output of the third power transistor and a reference voltage, wherein a tap of the third resistor ladder is coupled to the output of the fifth amplifier.

10. An electronic device, comprising:

an input voltage node and a load node; and a plurality of integrated circuits, each integrated circuit including:
- a power transistor connected between the input voltage node and the load node; and
- a regulation circuit configured to generate at least one sense current representative of an output current of that power transistor, wherein each regulation circuit comprises a first amplifier configured to drive a gate of its corresponding power transistor;

wherein each regulation circuit is configured to cause its corresponding power transistor to decrease its output current when its generated sense current is greater than a value derived from at least one of the sense currents generated by the regulation circuits of other integrated circuits in the plurality;

wherein each regulation circuit is configured to cause its corresponding power transistor to increase its output current when its generated sense current is less than the value derived from at least one of the sense currents generated by the regulation circuits of the other integrated circuits in the plurality;

wherein the regulation circuit is further configured to sink or source current from an input terminal of the first amplifier in response to a comparison between its associated sense current and the value derived from at least one of the sense currents generated by the regulation circuits of the other integrated circuits in the plurality.

11. The electronic device of claim 10, wherein the value derived from at least one of the sense currents generated by the regulation circuits of the other integrated circuits in the plurality is based on an average of the sense currents generated by the regulation circuits of the other integrated circuits in the plurality.

12. The electronic device of claim 10, wherein the value derived from at least one of the sense currents generated by the regulation circuits of the other integrated circuits in the plurality is based on one of the sense currents generated by one of the regulation circuits of the other integrated circuits in the plurality.

13. The electronic device of claim 10, wherein the plurality of integrated circuits are arranged in a daisy-chained relationship, such that each regulation circuit, except for the regulation circuit of a first integrated circuit in the daisy-chain, compares its associated sense current with the sense current generated by the regulation circuit of an immediately preceding integrated circuit in the daisy-chain, and such that the regulation circuit of the first integrated circuit compares its associated sense current with the sense current generated by the regulation circuit of a last integrated circuit in the daisy-chain.

14. The electronic device of claim 10, wherein each regulation circuit comprises an amplifier configured to directly compare its associated sense current with the value derived from at least one of the sense currents generated by the regulation circuits of the other integrated circuits in the plurality, and to drive a gate of its corresponding power transistor based upon the comparison.

15. The electronic device of claim 10, wherein each regulation circuit further comprises a second amplifier configured to perform the comparison between its associated sense current and the value derived from at least one of the sense currents generated by the regulation circuits of the other integrated circuits in the plurality, and to sink or source current from the input terminal of the first amplifier based upon the comparison.

* * * * *